United States Patent
Ju et al.

(10) Patent No.: US 8,659,175 B2
(45) Date of Patent: Feb. 25, 2014

(54) INTEGRATED CIRCUIT PACKAGE SYSTEM WITH OFFSET STACK

(75) Inventors: Jong Wook Ju, Icheon-Si (KR); Taeg Ki Lim, Cheongju-si (KR); Hyun Joung Kim, Namyangju (KR)

(73) Assignee: Stats Chippac Ltd., Singapore (SG)

( * ) Notice: Subject to any disclaimer, the term of this patent is extended or adjusted under 35 U.S.C. 154(b) by 821 days.

(21) Appl. No.: 11/762,055

(22) Filed: Jun. 12, 2007

(65) Prior Publication Data

US 2007/0296086 A1   Dec. 27, 2007

Related U.S. Application Data

(60) Provisional application No. 60/804,545, filed on Jun. 12, 2006.

(51) Int. Cl.
*H01L 23/48* (2006.01)
*H01L 23/52* (2006.01)

(52) U.S. Cl.
USPC ........... 257/784; 257/777; 257/686; 257/783; 257/E23.022; 257/E23.141; 438/109; 438/126; 438/617

(58) Field of Classification Search
USPC .............. 257/777, 686, 784, 783, E23.141, 257/E23.022; 438/109, 126, 617
See application file for complete search history.

(56) References Cited

U.S. PATENT DOCUMENTS

| | | | |
|---|---|---|---|
| 5,229,960 A * | 7/1993 | De Givry | 365/63 |
| 5,323,060 A | 6/1994 | Fogal et al. | |
| 5,804,004 A * | 9/1998 | Tuckerman et al. | 156/60 |
| 6,388,313 B1 | 5/2002 | Lee et al. | |
| 6,472,758 B1 | 10/2002 | Glenn et al. | |
| 6,569,709 B2 | 5/2003 | Derderian | |
| 6,657,290 B2 | 12/2003 | Fukui et al. | |
| 6,787,901 B2 | 9/2004 | Reyes et al. | |
| 7,199,458 B2 | 4/2007 | Lee | |
| 7,239,021 B2 | 7/2007 | Arai et al. | |
| 7,420,269 B2 * | 9/2008 | Ha et al. | 257/686 |
| 2002/0195697 A1 * | 12/2002 | Mess et al. | 257/686 |
| 2003/0029920 A1 * | 2/2003 | Chhor et al. | 235/492 |
| 2003/0038374 A1 * | 2/2003 | Shim et al. | 257/777 |
| 2003/0189259 A1 * | 10/2003 | Kurita et al. | 257/777 |
| 2005/0029645 A1 | 2/2005 | Mess et al. | |

(Continued)

FOREIGN PATENT DOCUMENTS

| CN | 1577841 A | 2/2005 |
|---|---|---|
| JP | 2004253805 A | 9/2004 |

(Continued)

OTHER PUBLICATIONS

TW Search Report for Taiwan Application No. 096121103, dated Jul. 22, 2013.

*Primary Examiner* — Nitin Parekh
(74) *Attorney, Agent, or Firm* — Ishimaru & Associates LLP (57) ABSTRACT

An integrated circuit package system is provided including mounting a first integrated circuit device over a carrier, mounting a second integrated circuit device having an adhesive spacer over the first integrated circuit device in an offset configuration, connecting a first internal interconnect between the carrier and the first integrated circuit device with the first internal interconnect within the adhesive spacer, connecting a second internal interconnect between the carrier and the second integrated circuit device, and encapsulating the first integrated circuit device, the second integrated circuit device, the first internal interconnect and the second internal interconnect.

19 Claims, 5 Drawing Sheets

(56) References Cited

U.S. PATENT DOCUMENTS

| | | | |
|---|---|---|---|
| 2005/0067694 A1* | 3/2005 | Pon et al. | 257/723 |
| 2005/0212144 A1 | 9/2005 | Rugg et al. | |
| 2006/0139893 A1* | 6/2006 | Yoshimura et al. | 361/735 |
| 2006/0267173 A1* | 11/2006 | Takiar et al. | 257/686 |
| 2007/0065987 A1 | 3/2007 | Mess et al. | |
| 2007/0187811 A1 | 8/2007 | Arai et al. | |

FOREIGN PATENT DOCUMENTS

| | | |
|---|---|---|
| JP | 3718205 B | 11/2005 |
| JP | 20065333 A | 1/2006 |
| KR | 20040075245 A | 8/2004 |

* cited by examiner

INTEGRATED CIRCUIT PACKAGE SYSTEM WITH OFFSET STACK

CROSS-REFERENCE TO RELATED APPLICATION(S)

This application claims the benefit of U.S. Provisional Patent Application No. 60/804,545 filed Jun. 12, 2006.

TECHNICAL FIELD

The present invention relates generally to an integrated circuit package system, and more particularly to an integrated circuit package system with multiple integrated circuits.

BACKGROUND ART

Electronics demand more integrated circuits in an integrated circuit package while paradoxically providing less physical space in the system for the increased integrated circuits content. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

Modern electronics, such as smart phones, personal digital assistants, location based services devices, servers, and storage arrays, are packing more integrated circuits into an ever shrinking physical space with expectations for decreasing cost. Numerous technologies have been developed to meet these requirements. Some of the research and development strategies focus on new package technologies while others focus on improving the existing package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever demanding integration of today's integrated circuits and packages.

Numerous package approaches stack multiple integrated circuit dice or package in package (PIP) or a combination thereof. The electrical connections to the each of the stacked integrated circuit require space typically formed by spacers, such as silicon or interposers. Current spacers require additional steps and structures increasing manufacturing costs and decreasing manufacturing yields. These spacers also limit the amount of height reduction.

In addition to the spacers, stacked integrated circuit dice or stacked packaged integrated circuits often suffer inadvertent shorting of the bond wires. The input/output (I/O) density and package profile requirements drive the bond pads and the bond wires closer and closer. As bond wires get closer, they become more susceptible to wire loop sweeps during molding process resulting in inadvertently shorting.

Thus, a need still remains for an integrated circuit package system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including mounting a first integrated circuit device over a carrier, mounting a second integrated circuit device having an adhesive spacer over the first integrated circuit device in an offset configuration, connecting a first internal interconnect between the carrier and the first integrated circuit device with the first internal interconnect within the adhesive spacer, connecting a second internal interconnect between the carrier and the second integrated circuit device, and encapsulating the first integrated circuit device, the second integrated circuit device, the first internal interconnect and the second internal interconnect.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Figure 1:
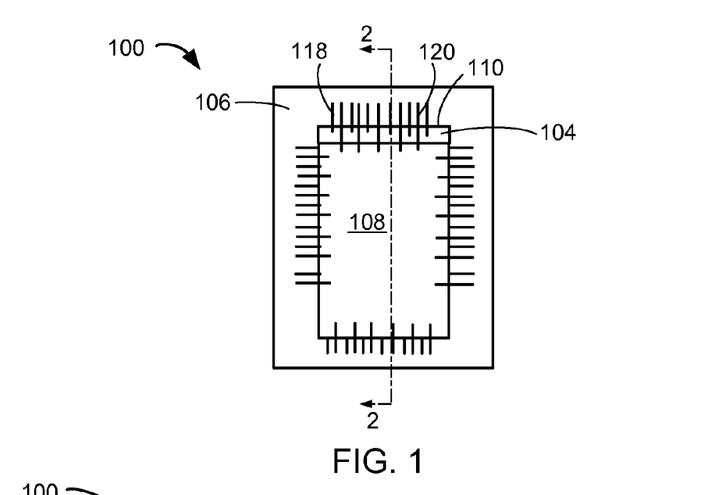
FIG. 1 is a plan view of an integrated circuit package system in a first embodiment of the present invention.

Referring now to FIG. 1, therein is shown a plan view of an integrated circuit package system 100 in a first embodiment of the present invention. The plan view depicts the integrated circuit package system 100 without a cover. The integrated circuit package system 100 preferably has a first integrated circuit device 104, such as an integrated circuit die, over a carrier 106, such as a laminate substrate. A second integrated circuit device 108, such as an integrated circuit die, is preferably over the first integrated circuit device 104 in an offset configuration. The offset configuration preferably has the second integrated circuit device 108 exposing a first side 110 of the first integrated circuit device 104.

First internal interconnects 118, such as bond wires or ribbon bond wires, preferably connect the first integrated circuit device 104 and the carrier 106. The first internal interconnects 118 connect to the exposed portion of the first integrated circuit device 104 adjacent to the first side 110. The first internal interconnects 118 also connect to portions of the first integrated circuit device 104 under the second integrated circuit device 108.

Second internal interconnects 120, such as bond wires or ribbon bond wires, preferably connect the second integrated circuit device 108 and the carrier 106. The second internal interconnects 120 may be adjacent to or between the first internal interconnects 118 or may be over the first internal interconnects 118 without causing inadvertent shorts with the first internal interconnects 118.

For illustrative purposes, the first integrated circuit device 104 and the second integrated circuit device 108 are shown as substantially the same size, although it is understood that the first integrated circuit device 104 and the second integrated circuit device 108 may be different sizes. Also for illustrative purposes, the integrated circuit package system 100 is shown having the carrier 106 as a laminated substrate, although it is understood that the carrier 106 may be of a different type. For example, the carrier 106 may be formed from a lead frame (not shown) having leads (not shown) and a die-attach paddle (not shown).

Figure 2:
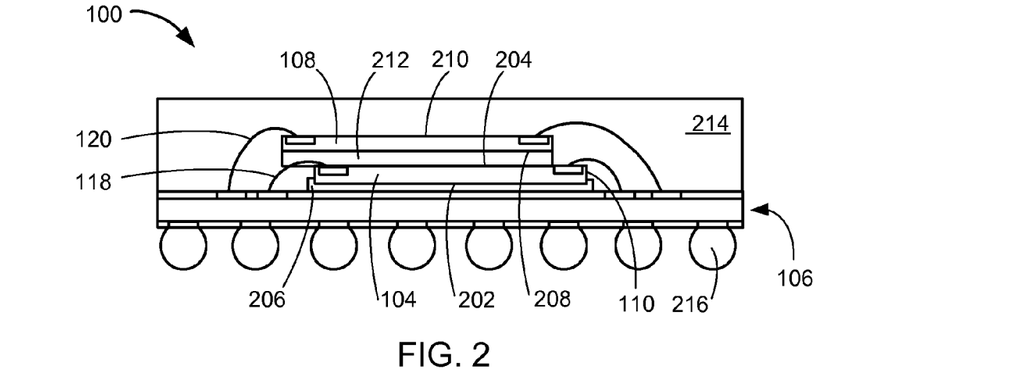
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depicts the first integrated circuit device 104, having a first non-active side 202 and a first active side 204, attached over the carrier 106 with an adhesive 206, such as a die-attach adhesive. The first non-active side 202 faces the carrier 106. The first active side 204 includes active circuitry fabricated thereon and faces away from the carrier 106. The first internal interconnects 118 connect the first active side 204 and the carrier 106.

The second integrated circuit device 108 has a second non-active side 208 and a second active side 210, wherein the second active side 210 has active circuitry fabricated thereon. An adhesive spacer 212, such as a film spacer, a thick film, or a thick paste adhesive, of only a single layer between or directly on the second non-active side 208 and the first active side 204 of the first integrated circuit device 104. The adhesive spacer 212 extends from between the second integrated circuit device 108 and the first integrated circuit device 104 along the second non-active side 208 to an outer vertical side of the second integrated circuit device 108 and overhangs the first integrated circuit device 104. The adhesive spacer 212 does not directly contact the carrier 106. The second integrated circuit device 108 having the adhesive spacer 212 mounts over the first integrated circuit device 104 in an offset configuration such that a portion of the first integrated circuit device 104 along the first side 110 is exposed. The second integrated circuit device 108 does not impede the connections between the first internal interconnects 118 and the first integrated circuit device 104 adjacent to the first side 110.

The adhesive spacer 212 mounts over sides of the first integrated circuit device 104 other than the first side 110. The adhesive spacer 212 serves a number of functions. For example, the adhesive spacer 212 may function as an attachment adhesive between the first integrated circuit device 104 and the second integrated circuit device 108. As another example, the adhesive spacer 212 also functions as a spacer between the first integrated circuit device 104 and the second integrated circuit device 108 without interfering or perturbing the connections of the first internal interconnects 118 with portions of the first integrated circuit device 104 not exposed by the second integrated circuit device 108. The first internal interconnects 118 under the second integrated circuit device 108 are preferably within the adhesive spacer 212 overhanging the first integrated circuit device 108 and connected to a portion of the carrier 106 beyond the outer vertical side of the second integrated circuit device 108.

The second internal interconnects 120 attach the second integrated circuit device 108 and the carrier 106. The adhesive spacer 212 also provide additional distance between the first internal interconnects 118 and the second internal interconnects 120 such that the second internal interconnects 120 may loop over the first internal interconnects 118 without inadvertent shorting.

A package encapsulation 214, such as an epoxy molding compound, covers the first integrated circuit device 104, the second integrated circuit device 108, the first internal interconnects 118, and the second internal interconnects 120 over the carrier 106. External interconnects 216, such as solder balls, attach under the carrier 106.

Figure 3:
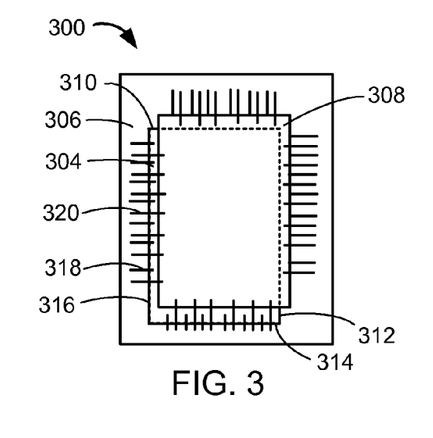
FIG. 3 is a plan view of an integrated circuit package system in a second embodiment of the present invention.

Referring now to FIG. 3, therein is shown a plan view of an integrated circuit package system 300 in a second embodiment of the present invention. The plan view depicts the integrated circuit package system 300 without a cover, such as the package encapsulation 214 of FIG. 2. The integrated circuit package system 300 preferably has a first integrated circuit device 304, such as an integrated circuit die, over a carrier 306, such as a laminate substrate. A second integrated circuit device 308, such as an integrated circuit die, is preferably over the first integrated circuit device 304 in an offset configuration.

The offset configuration preferably has the second integrated circuit device 308 exposing a portion of a first side 310, a portion of a second side 312, a third side 314, and a fourth side 316 of the first integrated circuit device 304. The first side 310 and the second side 312 are adjacent sides to each other. The first side 310 and the third side 314 are opposite sides to each other.

First internal interconnects 318, such as bond wires or ribbon bond wires, preferably connect the first integrated circuit device 304 and the carrier 306. The first internal interconnects 318 connect to the exposed portion of the first integrated circuit device 304 adjacent to the third side 314 and the fourth side 316. The first internal interconnects 318 also connect to portions of the first integrated circuit device 304 adjacent to the first side 310 and the second side 312 both under the second integrated circuit device 308. The adhesive spacer 212 of FIG. 2 is also preferably between the first integrated circuit device 304 and the second integrated circuit device 308 providing substantially the same functions as described for the integrated circuit package system 100 of FIG. 2.

Second internal interconnects 320, such as bond wires or ribbon bond wires, preferably connect the second integrated circuit device 308 and the carrier 306. The second internal interconnects 320 may be adjacent to or between the first internal interconnects 318 or may be over the first internal interconnects 318 without causing inadvertent shorts with the first internal interconnects 318.

For illustrative purposes, the first integrated circuit device 304 and the second integrated circuit device 308 are shown as substantially the same size, although it is understood that the first integrated circuit device 304 and the second integrated circuit device 308 may be different sizes. Also for illustrative purposes, the integrated circuit package system 300 is shown having the carrier 306 as a laminated substrate, although it is understood that the carrier 306 may be of a different type. For example, the carrier 306 may be formed from a lead frame (not shown) having leads (not shown) and a die-attach paddle (not shown).

Figure 4:
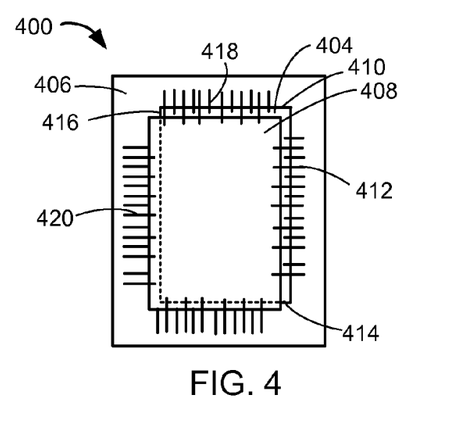
FIG. 4 is a plan view of an integrated circuit package system in a third embodiment of the present invention.

Referring now to FIG. 4, therein is shown a plan view of an integrated circuit package system 400 in a third embodiment of the present invention. The plan view depicts the integrated circuit package system 400 without a cover, such as the package encapsulation 214 of FIG. 2. The integrated circuit package system 400 preferably has a first integrated circuit device 404, such as an integrated circuit die, over a carrier 406, such as a laminate substrate. A second integrated circuit device 408, such as an integrated circuit die, is preferably over the first integrated circuit device 404 in an offset configuration.

The offset configuration preferably has the second integrated circuit device 408 exposing a first side 410, a second side 412, a portion of a third side 414, and a portion of a fourth side 416 of the first integrated circuit device 404. The first side 410 and the second side 412 are adjacent sides to each other. The first side 410 and the third side 414 are opposite sides to each other.

First internal interconnects 418, such as bond wires or ribbon bond wires, preferably connect the first integrated circuit device 404 and the carrier 406. The first internal interconnects 418 connect to the exposed portion of the first integrated circuit device 404 adjacent to the first side 410 and the second side 412. The first internal interconnects 418 also connect to portions of the first integrated circuit device 404 adjacent to the third side 414 and the fourth side 416 both under the second integrated circuit device 408. The adhesive spacer 212 of FIG. 2 is also preferably between the first integrated circuit device 404 and the second integrated circuit device 408 providing substantially the same functions as described for the integrated circuit package system 100 of FIG. 2.

Second internal interconnects 420, such as bond wires or ribbon bond wires, preferably connect the second integrated circuit device 408 and the carrier 406. The second internal interconnects 420 may be adjacent to or between the first internal interconnects 418 or may be over the first internal interconnects 418 without causing inadvertent shorts with the first internal interconnects 418.

For illustrative purposes, the first integrated circuit device 404 and the second integrated circuit device 408 are shown as substantially the same size, although it is understood that the first integrated circuit device 404 and the second integrated circuit device 408 may be different sizes. Also for illustrative purposes, the integrated circuit package system 400 is shown having the carrier 406 as a laminated substrate, although it is understood that the carrier 406 may be of a different type. For example, the carrier 406 may be formed from a lead frame (not shown) having leads (not shown) and a die-attach paddle (not shown).

Figure 5:
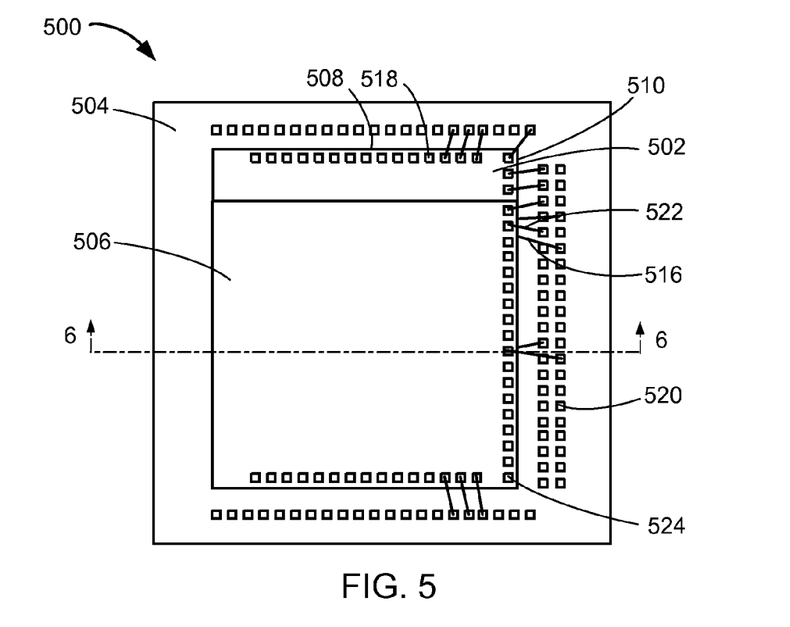
FIG. 5 is a plan view of an integrated circuit package system in a fourth embodiment of the present invention.

Referring now to FIG. 5, therein is shown a plan view of an integrated circuit package system 500 in a fourth embodiment of the present invention. The plan view depicts the integrated circuit package system 500 without a cover. The integrated circuit package system 500 preferably has a first integrated circuit device 502, such as a packaged integrated circuit, over a carrier 504, such as a laminate substrate. A second integrated circuit device 506, such as a packaged integrated circuit, is preferably over the first integrated circuit device 502 in an offset configuration. The offset configuration preferably has the second integrated circuit device 506 exposing a first side 508 and a portion of a second side 510 of the first integrated circuit device 502.

First internal interconnects 516, such as bond wires or ribbon bond wires, preferably connect first terminals 518, such as terminal pads or connection sites, of the first integrated circuit device 502 and contact pads 520 of the carrier 504. The first internal interconnects 516 preferably connect to the first integrated circuit device 502 adjacent to the first side 508 and the second side 510. The first internal interconnects 516 also connect to portions of the first integrated circuit device 502 under the second integrated circuit device 506.

Second internal interconnects 522, such as bond wires or ribbon bond wires, preferably connect second terminals 524, such as terminal pads or connection sites, of the second integrated circuit device 506 and the contact pads 520. The second internal interconnects 522 may be adjacent to or between the first internal interconnects 516 or may be over the first internal interconnects 516 without causing inadvertent shorts with the first internal interconnects 516.

For illustrative purposes, a limited number of the first internal interconnects 516 are shown between the first integrated circuit device 502 and the carrier 504, although it is understood that the number of the first internal interconnects 516 between the first integrated circuit device 502 and the carrier 504 may be a predetermined number as appropriate. Also for illustrative purposes, a limited number of the second internal interconnects 522 are shown between the second integrated circuit device 506 and the carrier 504, although it is understood that the number of the second internal interconnects 522 between the second integrated circuit device 506 and the carrier 504 may be a predetermined number as appropriate.

Figure 6:
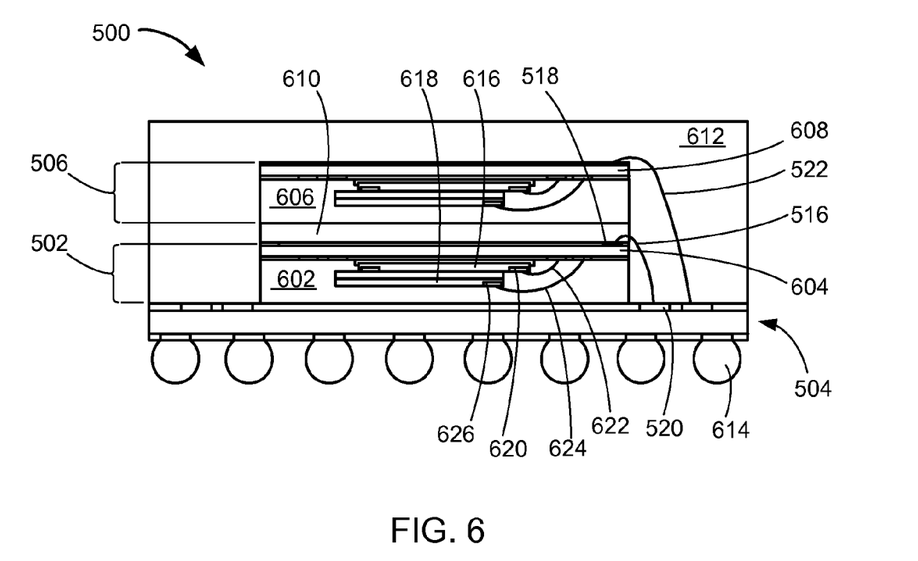
FIG. 6 is a cross-sectional view of the integrated circuit package system along line 6-6 of FIG. 5.

Referring now to FIG. 6, therein is shown a cross-sectional view of the integrated circuit package system 500 along line 6-6 of FIG. 5. The cross-sectional view depicts the integrated circuit package system 500 as an integrated package-in-package system with the first integrated circuit device 502 and the second integrated circuit device 506.

The first integrated circuit device 502 includes a first encapsulation 602, such as an epoxy molding compound, and a first substrate 604. The first integrated circuit device 502 mounts over the carrier 504 with the first encapsulation 602 facing the carrier 504. The first internal interconnects 516 preferably connect the first terminals 518 of the first substrate 604 and the contact pads 520.

The second integrated circuit device 506 includes a second encapsulation 606, such as an epoxy molding compound, and a second substrate 608. An adhesive spacer 610, such as a film spacer, a thick film, or a thick paste adhesive, covers a horizontal portion of the second encapsulation 606. The second integrated circuit device 506 having the adhesive spacer 610 mounts over the first integrated circuit device 502 such that the second integrated circuit device 506 does not impede the connections between the first internal interconnects 516 and the first integrated circuit device 502. The adhesive spacer 610 mounts over the first substrate 604.

The adhesive spacer 610 serves a number of functions. For example, the adhesive spacer 610 may function as an attachment adhesive between the first integrated circuit device 502 and the second integrated circuit device 506. As another example, the adhesive spacer 610 also functions as a spacer between the first integrated circuit device 502 and the second integrated circuit device 506 without interfering or perturbing the connections of the first internal interconnects 516 with the first terminals of the first substrate 604. The first internal interconnects 516 under the second integrated circuit device 506 are preferably within the adhesive spacer 610.

The second internal interconnects 522 attach the second substrate 608 and the carrier 504. The adhesive spacer 610 also provide additional distance between the first internal interconnects 516 and the second internal interconnects 522 such that the second internal interconnects 522 may loop over the first internal interconnects 516 without inadvertent shorting.

A package encapsulation 612, such as an epoxy molding compound, covers the first integrated circuit device 502, the second integrated circuit device 506, the first internal interconnects 516, and the second internal interconnects 522 over the carrier 504. External interconnects 614, such as solder balls, attach under the carrier 504.

The first integrated circuit device 502 further preferably includes a first integrated circuit die 616 mounted under the first substrate 604. The first integrated circuit device 502 also preferably includes a second integrated circuit die 618 mounted below the first integrated circuit die 616 in an offset configuration exposing first bond pads 620, such as connection sites, of the first integrated circuit die 616. First inner interconnects 622, such as bond wires or ribbon bond wires, preferably connect the first bond pads 620 and the first substrate 604. Second inner interconnects 624, such as bond wires or ribbon bond wires, preferably connect the first substrate 604 and second bond pads 626, such as connection sites, of the second integrated circuit die 618. The first encapsulation 602 cover the first integrated circuit die 616, the second integrated circuit die 618, the first inner interconnects 622, and the second inner interconnects 624 under the first substrate 604.

The second integrated circuit device 506 is shown preferably having substantially the same structure. For illustrative purposes, the first integrated circuit device 502 and the second integrated circuit device 506 are shown having stacked integrated circuits in an offset configuration, although it is understood that the first integrated circuit device 502 and the second integrated circuit device 506 may be other types of integrated circuits devices. For example, the first integrated circuit device 502 and the second integrated circuit device 506 may not have stacked integrated circuits. As another example, the first integrated circuit device 502 and the second integrated circuit device 506 may have integrated circuits of different types, such as size, semiconductor technologies, or functions.

Figure 7:
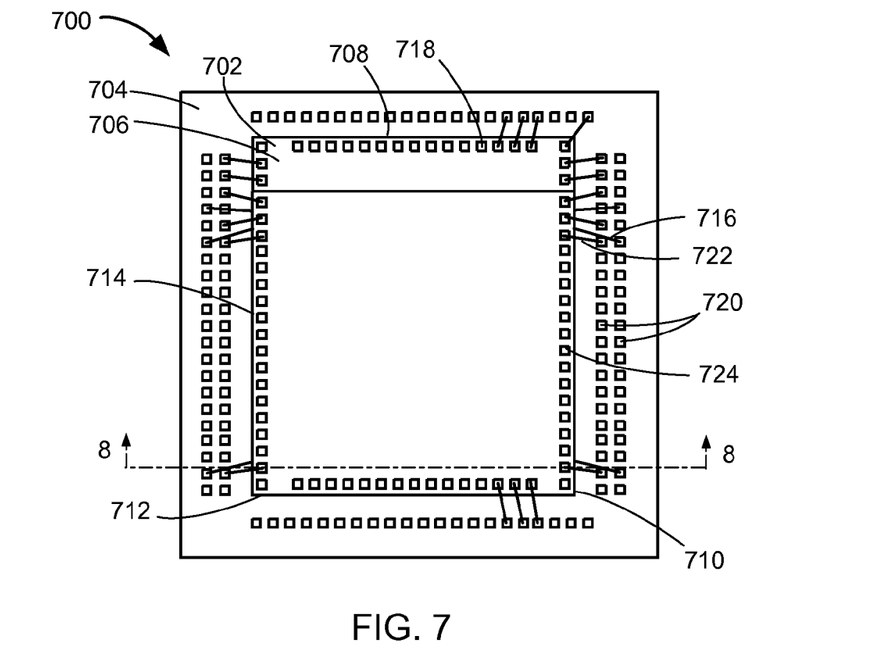
FIG. 7 is a plan view of an integrated circuit package system in a fifth embodiment of the present invention.

Referring now to FIG. 7, therein is shown a plan view of an integrated circuit package system 700 in a fifth embodiment of the present invention. The plan view depicts the integrated circuit package system 700 without a cover. The integrated circuit package system 700 preferably has a first integrated circuit device 702, such as a packaged integrated circuit, over a carrier 704, such as a laminate substrate. A second integrated circuit device 706, such as a packaged integrated circuit, is preferably over the first integrated circuit device 702 in an offset configuration.

The offset configuration preferably has the second integrated circuit device 706 exposing a first side 708, a portion of a second side 710, and a portion of a fourth side 714 of the first integrated circuit device 702. A third side 712 of the first integrated circuit device 702 is under the second integrated circuit device 706.

First internal interconnects 716, such as bond wires or ribbon bond wires, preferably connect first terminals 718, such as terminal pads or connection sites, of the first integrated circuit device 702 and contact pads 720 of the carrier 704. The first internal interconnects 716 preferably connect to the first integrated circuit device 702 adjacent to the first side 708, the second side 710, the third side 712, and the fourth side 714.

Second internal interconnects 722, such as bond wires or ribbon bond wires, preferably connect second terminals 724, such as terminal pads or connection sites, of the second integrated circuit device 706 and the contact pads 720. The second internal interconnects 722 may be adjacent to or between the first internal interconnects 716 or may be over the first internal interconnects 716 without causing inadvertent shorts with the first internal interconnects 716.

For illustrative purposes, a limited number of the first internal interconnects 716 are shown between the first integrated circuit device 702 and the carrier 704, although it is understood that the number of the first internal interconnects 716 between the first integrated circuit device 702 and the carrier 704 may be a predetermined number as appropriate. Also for illustrative purposes, a limited number of the second internal interconnects 722 are shown between the second integrated circuit device 706 and the carrier 704, although it is understood that the number of the second internal interconnects 722 between the second integrated circuit device 706 and the carrier 704 may be a predetermined number as appropriate.

Figure 8:
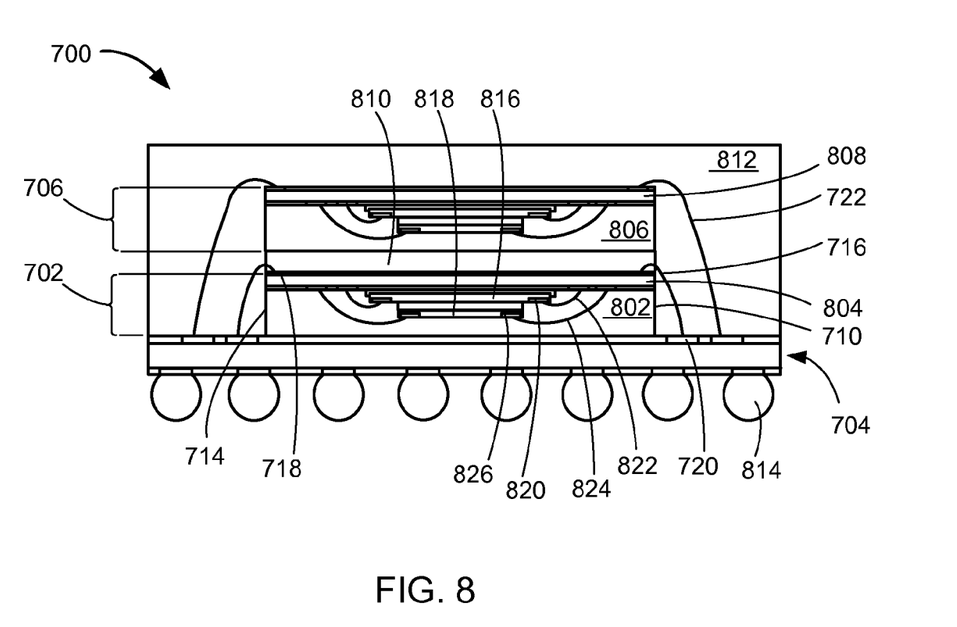
FIG. 8 is a cross-sectional view of the integrated circuit package system along line 8-8 of FIG. 7.

Referring now to FIG. 8, therein is shown a cross-sectional view of the integrated circuit package system 700 along line 8-8 of FIG. 7. The cross-sectional view depicts the integrated circuit package system 700 as an integrated package-in-package system with the first integrated circuit device 702 and the second integrated circuit device 706.

The first integrated circuit device 702 includes a first encapsulation 802, such as an epoxy molding compound, and a first substrate 804. The first integrated circuit device 702 mounts over the carrier 704 with the first encapsulation 802 facing the carrier 704. The first internal interconnects 716 preferably connect the contact pads 720 and the first terminals 718 of the first substrate 804 along the second side 710 and the fourth side 714.

The second integrated circuit device 706 includes a second encapsulation 806, such as an epoxy molding compound, and a second substrate 808. An adhesive spacer 810, such as a film spacer, a thick film, or a thick paste adhesive, covers a horizontal portion of the second encapsulation 806. The second integrated circuit device 706 having the adhesive spacer 810 mounts over the first integrated circuit device 702 such that the second integrated circuit device 706 does not impede the connections between the first internal interconnects 716 and the first integrated circuit device 702. The adhesive spacer 810 mounts over the first substrate 804.

The adhesive spacer 810 serves a number of functions. For example, the adhesive spacer 810 may function as an attachment adhesive between the first integrated circuit device 702 and the second integrated circuit device 706. As another example, the adhesive spacer 810 also functions as a spacer between the first integrated circuit device 702 and the second integrated circuit device 706 without interfering or perturbing the connections of the first internal interconnects 716 with the first terminals of the first substrate 804. The first internal interconnects 716 under the second integrated circuit device 706 are preferably within the adhesive spacer 810.

The second internal interconnects 722 attach the second substrate 808 and the carrier 704. The adhesive spacer 810 also provide additional distance between the first internal interconnects 716 and the second internal interconnects 722 such that the second internal interconnects 722 may loop over the first internal interconnects 716 without inadvertent shorting.

A package encapsulation 812, such as an epoxy molding compound, covers the first integrated circuit device 702, the second integrated circuit device 706, the first internal interconnects 716, and the second internal interconnects 722 over the carrier 704. External interconnects 814, such as solder balls, attach under the carrier 704.

The first integrated circuit device 702 further preferably includes a first integrated circuit die 816 mounted under the first substrate 804. The first integrated circuit device 702 also preferably includes a second integrated circuit die 818 mounted below the first integrated circuit die 816 exposing first bond pads 820, such as connection sites, of the first integrated circuit die 816. First inner interconnects 822, such as bond wires or ribbon bond wires, preferably connect the first bond pads 820 and the first substrate 804. Second inner interconnects 824, such as bond wires or ribbon bond wires, preferably connect the first substrate 804 and second bond pads 826, such as connection sites, of the second integrated circuit die 818. The first encapsulation 802 cover the first integrated circuit die 816, the second integrated circuit die 818, the first inner interconnects 822, and the second inner interconnects 824 under the first substrate 804.

The second integrated circuit device 706 is shown preferably having substantially the same structure. For illustrative purposes, the first integrated circuit device 702 and the second integrated circuit device 706 are shown having stacked integrated circuits, although it is understood that the first integrated circuit device 702 and the second integrated circuit device 706 may be other types of integrated circuits devices. For example, the first integrated circuit device 702 and the second integrated circuit device 706 may not have stacked integrated circuits. As another example, the first integrated circuit device 702 and the second integrated circuit device 706 may have integrated circuits of different types, such as size, semiconductor technologies, or functions.

Figure 9:
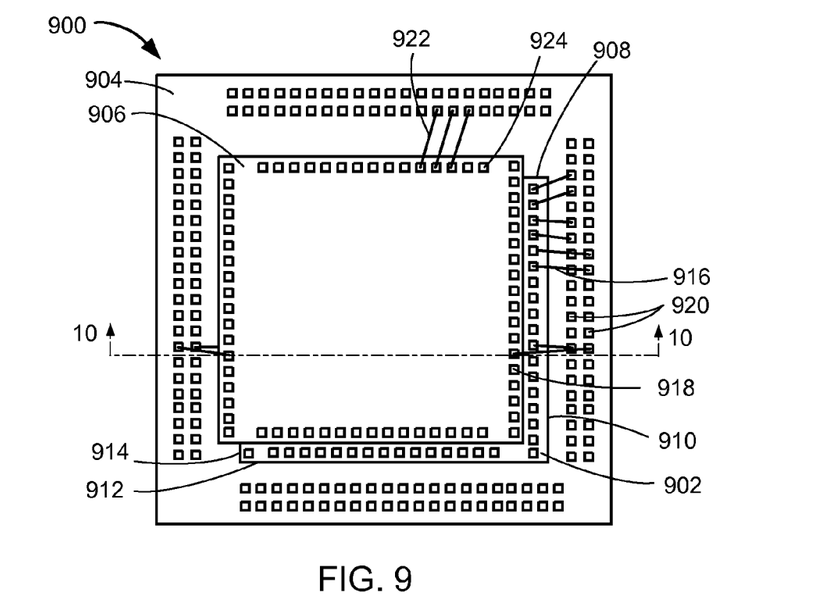
FIG. 9 is a plan view of an integrated circuit package system in a sixth embodiment of the present invention.

Referring now to FIG. 9, therein is shown a plan view of an integrated circuit package system 900 in a sixth embodiment of the present invention. The plan view depicts the integrated circuit package system 900 without a cover. The integrated circuit package system 900 preferably has a first integrated circuit device 902, such as a packaged integrated circuit, over a carrier 904, such as a laminate substrate. A second integrated circuit device 906, such as a packaged integrated circuit, is preferably over the first integrated circuit device 902 in an offset configuration. The offset configuration preferably has the second integrated circuit device 906 exposing a portion of a first side 908, second side 910, a third side 912, and a portion of a fourth side 914 of the first integrated circuit device 902.

First internal interconnects 916, such as bond wires or ribbon bond wires, preferably connect first terminals 918, such as terminal pads or connection sites, of the first integrated circuit device 902 and contact pads 920 of the carrier 904. The first internal interconnects 916 preferably connect to the first integrated circuit device 902 adjacent to the first side 908, the second side 910, the third side 912, and the fourth side 914.

Second internal interconnects 922, such as bond wires or ribbon bond wires, preferably connect second terminals 924, such as terminal pads or connection sites, of the second integrated circuit device 906 and the contact pads 920. The second internal interconnects 922 may be adjacent to or between the first internal interconnects 916 or may be over the first internal interconnects 916 without causing inadvertent shorts with the first internal interconnects 916.

For illustrative purposes, a limited number of the first internal interconnects 916 are shown between the first integrated circuit device 902 and the carrier 904, although it is understood that the number of the first internal interconnects 916 between the first integrated circuit device 902 and the carrier 904 may be a predetermined number as appropriate. Also for illustrative purposes, a limited number of the second internal interconnects 922 are shown between the second integrated circuit device 906 and the carrier 904, although it is understood that the number of the second internal interconnects 922 between the second integrated circuit device 906 and the carrier 904 may be a predetermined number as appropriate.

Figure 10:
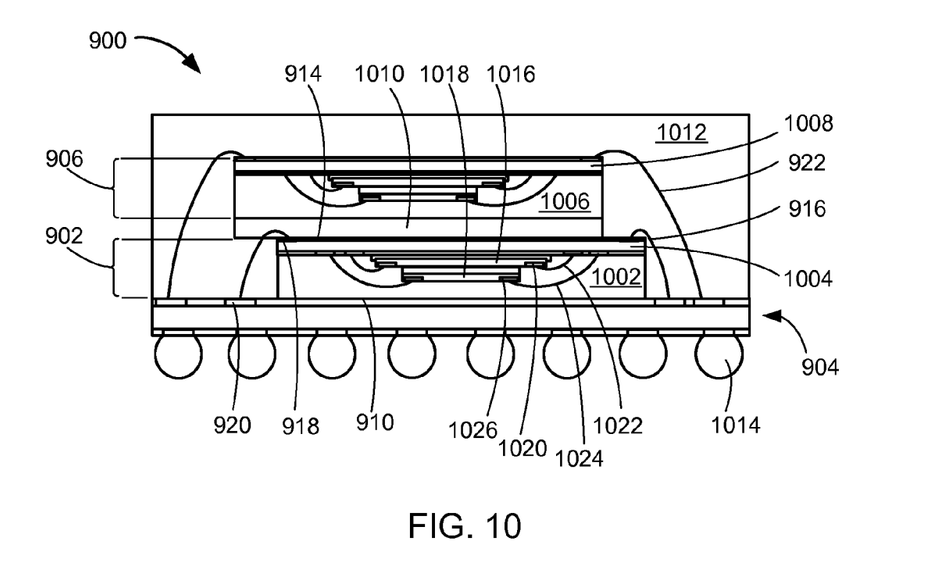
FIG. 10 is a cross-sectional view of the integrated circuit package system along line 10-10 of FIG. 9.

Referring now to FIG. 10, therein is shown a cross-sectional view of the integrated circuit package system 900 along line 10-10 of FIG. 9. The cross-sectional view depicts the integrated circuit package system 900 as an integrated package-in-package system with the first integrated circuit device 902 and the second integrated circuit device 906.

The first integrated circuit device 902 includes a first encapsulation 1002, such as an epoxy molding compound, and a first substrate 1004. The first integrated circuit device 902 mounts over the carrier 904 with the first encapsulation 1002 facing the carrier 904. The first internal interconnects 916 preferably connect the contact pads 920 and the first terminals 918 of the first substrate 1004 along the second side 910 and the fourth side 914.

The second integrated circuit device 906 includes a second encapsulation 1006, such as an epoxy molding compound, and a second substrate 1008. An adhesive spacer 1010, such as a film spacer, a thick film, or a thick paste adhesive, covers a horizontal portion of the second encapsulation 1006. The second integrated circuit device 906 having the adhesive spacer 1010 mounts over the first integrated circuit device 902 in an offset configuration such that the adhesive spacer 1010 and the second integrated circuit device 906 exposes the first terminals 918 along the second side 910. The adhesive spacer 1010 mounts over the first substrate 1004.

The adhesive spacer 1010 serves a number of functions. For example, the adhesive spacer 1010 may function as an attachment adhesive between the first integrated circuit device 902 and the second integrated circuit device 906. As another example, the adhesive spacer 1010 also functions as a spacer between the first integrated circuit device 902 and the second integrated circuit device 906 without interfering or perturbing the connections of the first internal interconnects 916 with the first terminals of the first substrate 1004. The first internal interconnects 916 under the second integrated circuit device 906 are preferably within the adhesive spacer 1010.

The second internal interconnects 922 attach the second substrate 1008 and the carrier 904. The adhesive spacer 1010 also provide additional distance between the first internal interconnects 916 and the second internal interconnects 922 such that the second internal interconnects 922 may loop over the first internal interconnects 916 without inadvertent shorting.

A package encapsulation 1012, such as an epoxy molding compound, covers the first integrated circuit device 902, the second integrated circuit device 906, the first internal interconnects 916, and the second internal interconnects 922 over the carrier 904. External interconnects 1014, such as solder balls, attach under the carrier 904.

The first integrated circuit device 902 further preferably includes a first integrated circuit die 1016 mounted under the first substrate 1004. The first integrated circuit device 902 also preferably includes a second integrated circuit die 1018 mounted below the first integrated circuit die 1016 exposing first bond pads 1020, such as connection sites, of the first integrated circuit die 1016. First inner interconnects 1022, such as bond wires or ribbon bond wires, preferably connect the first bond pads 1020 and the first substrate 1004. Second inner interconnects 1024, such as bond wires or ribbon bond wires, preferably connect the first substrate 1004 and second bond pads 1026, such as connection sites, of the second integrated circuit die 1018. The first encapsulation 1002 cover the first integrated circuit die 1016, the second integrated circuit die 1018, the first inner interconnects 1022, and the second inner interconnects 1024 under the first substrate 1004.

The second integrated circuit device 906 is shown preferably having substantially the same structure. For illustrative purposes, the first integrated circuit device 902 and the second integrated circuit device 906 are shown having stacked integrated circuits, although it is understood that the first integrated circuit device 902 and the second integrated circuit device 906 may be other types of integrated circuits devices. For example, the first integrated circuit device 902 and the second integrated circuit device 906 may not have stacked integrated circuits. As another example, the first integrated circuit device 902 and the second integrated circuit device 906 may have integrated circuits of different types, such as size, semiconductor technologies, or functions.

Figure 11:
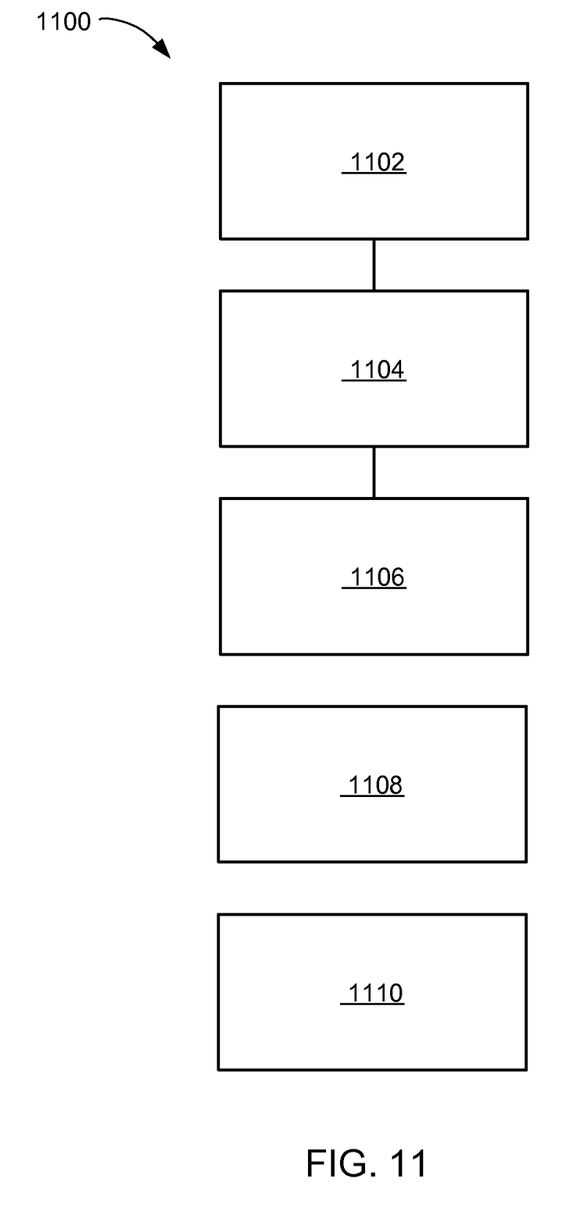
FIG. 11 is a flow chart of an integrated circuit package system for manufacturing the integrated circuit package system in an embodiment of the present invention.

Referring now to FIG. 11, therein is shown a flow chart of an integrated circuit package system 1100 for manufacturing the integrated circuit package system 100 in an embodiment of the present invention. The system 1100 includes mounting a first integrated circuit device over a carrier in a block 1102; mounting a second integrated circuit device having an adhesive spacer over the first integrated circuit device in an offset configuration in a block 1104; connecting a first internal interconnect between the carrier and the first integrated circuit device with the first internal interconnect within the adhesive spacer in a block 1106; connecting a second internal interconnect between the carrier and the second integrated circuit device in a block 1108; and encapsulating the first integrated circuit device, the second integrated circuit device, the first internal interconnect and the second internal interconnect in a block 1110.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of integrated circuit package system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. An integrated circuit package system comprising:
   a carrier;
   a first integrated circuit device over the carrier;
   a first internal interconnect between the carrier and the first integrated circuit device;
   a second integrated circuit device having an adhesive spacer of a single layer extended from between the second integrated circuit device and the first integrated circuit device in an offset configuration from the second integrated circuit device with the first internal interconnect partially within the adhesive spacer overhanging the first integrated circuit device and extended to an outer vertical side of the second integrated circuit device;
   a second internal interconnect between the carrier and the second integrated circuit device;
   a package encapsulation over the first integrated circuit device, the second integrated circuit device, the first internal interconnect, and the second internal interconnect, and the second integrated circuit device over the first integrated circuit device in the offset configuration includes a connection site adjacent to a first side of the first integrated circuit device and the connection site is not being directly under the adhesive spacer; and
   the second internal interconnect is connected to the second integrated circuit device at a second side of the second integrated circuit device opposite the first side.

2. The system as claimed in claim 1 further comprising a further first internal interconnect between the carrier and the first integrated circuit device includes the further first internal interconnect not within the adhesive spacer.

3. The system as claimed in claim 1 wherein:
   the first integrated circuit device is a first integrated circuit die; and
   the second integrated circuit device is a second integrated circuit die.

4. The system as claimed in claim 1 wherein:
the first integrated circuit device is a first integrated circuit package system; and
the second integrated circuit device is a second integrated circuit package system.

5. The system as claimed in claim 1 further comprising an external interconnect under the carrier.

6. The system as claimed in claim 1 wherein the first internal interconnect is between the carrier and the connection site.

7. The system as claimed in claim 1 wherein the second integrated circuit device having the adhesive spacer over the first integrated circuit device in the offset configuration includes the connection site adjacent to the first side of the first integrated circuit device not directly under the adhesive spacer.

8. The system as claimed in claim 1 wherein a first non-active side of the first integrated circuit device faces the carrier.

9. The system as claimed in claim 1 further comprising the first integrated circuit device and the second integrated circuit device are substantially the same size to each other.

10. A method for manufacture of an integrated circuit package system comprising:
mounting a first integrated circuit device over a carrier;
connecting a first internal interconnect between the carrier and the first integrated circuit device;
mounting a second integrated circuit device having an adhesive spacer of a single layer extended from between the second integrated circuit device and the first integrated circuit device in an offset configuration from the second integrated circuit device with the first internal interconnect partially within the adhesive spacer overhanging the first device and extended to an outer vertical side of the second integrated circuit device,
connecting a second internal interconnect between the carrier and the second integrated circuit device;
encapsulating the first integrated circuit device, the second integrated circuit device, the first internal interconnect and the second internal interconnect, and the second integrated circuit device over the first integrated circuit device in the offset configuration includes a connection site adjacent to a first side of the first integrated circuit device and the connection site is not being directly under the adhesive spacer; and
the second internal interconnect is connected to the second integrated circuit device at a second side of the second integrated circuit device opposite the first side.

11. The method as claimed in claim 10 further comprising connecting a further first internal interconnect between the carrier and the first integrated circuit device includes connecting the further first internal interconnect not within the adhesive spacer.

12. The method as claimed in claim 10 wherein:
mounting the first integrated circuit device includes:
mounting a first integrated circuit die; and
mounting the second integrated circuit device includes:
mounting a second integrated circuit die.

13. The method as claimed in claim 10 wherein:
mounting the first integrated circuit device includes:
mounting a first integrated circuit package system; and
mounting the second integrated circuit device includes:
mounting a second integrated circuit package system.

14. The method as claimed in claim 10 further comprising attaching an external interconnect under the carrier.

15. A method for manufacture of an integrated circuit package system comprising:
mounting a first integrated circuit device over a carrier;
connecting a first internal interconnect between the carrier and the first integrated circuit device;
mounting a second integrated circuit device having an adhesive spacer of a single layer extended from between the second integrated circuit device and the first integrated circuit device in an offset configuration from the second integrated circuit device with the first internal interconnect within the adhesive spacer overhanging the first integrated circuit device and extended to an outer vertical side of the second integrated circuit device with a connection site adjacent to a first side of the first integrated circuit device not directly under the adhesive spacer;
connecting a second internal interconnect between the carrier and the second integrated circuit device at a side opposite the first side; and
encapsulating the first integrated circuit device, the second integrated circuit device, the first internal interconnect, and the second internal interconnect.

16. The method as claimed in claim 15 wherein connecting the first internal interconnect includes connecting the carrier and the connection site.

17. The method as claimed in claim 15 wherein mounting the second integrated circuit device having the adhesive spacer over the first integrated circuit device in the offset configuration includes exposing the connection site adjacent to the first side of the first integrated circuit device not directly under the adhesive spacer.

18. The method as claimed in claim 15 wherein mounting the first integrated circuit device includes mounting the first integrated circuit device with a first non-active side of the first integrated circuit device facing the carrier.

19. The method as claimed in claim 15 further comprising providing the first integrated circuit device and the second integrated circuit device with substantially the same size to each other.

* * * * *